United States Patent
Tanabe et al.

[11] Patent Number: 5,874,130
[45] Date of Patent: Feb. 23, 1999

[54] WAFER AND METHOD OF PRODUCING A WAFER

[75] Inventors: Keiichiro Tanabe; Yuichiro Seki; Naoji Fujimori, all of Itami, Japan

[73] Assignee: Sumitomo Electric Industries, Ltd., Osaka, Japan

[21] Appl. No.: 942,294

[22] Filed: Oct. 1, 1997

Related U.S. Application Data

[62] Division of Ser. No. 480,786, Jun. 7, 1995, Pat. No. 5,736,226.

[30] Foreign Application Priority Data

Jun. 9, 1994 [JP] Japan ................................. 6-152701

[51] Int. Cl.$^6$ ............................ H01L 21/461; B24B 1/00; C30B 25/14
[52] U.S. Cl. ..................... 427/249; 427/255; 427/255.2; 427/532; 427/560
[58] Field of Search .................................. 427/249, 255, 427/255.2, 532, 560

[56] References Cited

U.S. PATENT DOCUMENTS

| | | | |
|---|---|---|---|
| 4,836,881 | 6/1989 | Satoh et al. | 423/446 |
| 4,863,529 | 9/1989 | Imai et al. | 437/100 |
| 5,071,785 | 12/1991 | Nakazato et al. | 457/62 |
| 5,240,749 | 8/1993 | Chow . | |
| 5,241,140 | 8/1993 | Itoh et al. | 181/169 |
| 5,270,028 | 12/1993 | Tanabe et al. | 423/446 |
| 5,270,077 | 12/1993 | Knemeyer et al. | 427/249 |
| 5,273,731 | 12/1993 | Anthony et al. | 423/446 |
| 5,294,381 | 3/1994 | Iguchi et al. | 264/25 |
| 5,382,809 | 1/1995 | Nishibayashi et al. | 257/77 |
| 5,587,013 | 12/1996 | Ikegaya et al. | 117/929 |

FOREIGN PATENT DOCUMENTS

| | | |
|---|---|---|
| 0517239 | 12/1992 | European Pat. Off. . |
| 0551730 | 7/1993 | European Pat. Off. . |
| 0562574 | 9/1993 | European Pat. Off. . |
| 0587068 | 3/1994 | European Pat. Off. . |
| 0614998 | 9/1994 | European Pat. Off. . |
| 0 040 137 | 11/1981 | Germany . |
| 62-252937 | 11/1987 | Japan . |
| 2026900 | 1/1990 | Japan . |
| 2173264 | 7/1990 | Japan . |
| 63256356 | 10/1998 | Japan . |

OTHER PUBLICATIONS

IEEE 1993 Ultrasonics Symposium Proceedings, Oct.–Nov. 1993.
Patent Abstracts of Japan, vol. 017, No. 434, Aug. 1993, Abstract.
2300 J. of Crystal Growth 128 (1993) Mar. I, Nos. 1/4, Amsterdam, NL, 413–417.
JP–A–05 090888 (Sumitomo Electric Ind Ltd) Apr. 9, 1993.
Wild et al., "Textured Growth and Twinning in Polycrystalline CVD Diamond films", Proceedings of the Second International Symposium on Diamond Materials, vol. 91–8 (1991), US, pp. 224–239.
Wolter et al., "Textured Growth of Diamond on Silicon Via in situ Carburization and Bias–Enhanced Nucleation", Applied Physics Letters vol. 62, No. 11, 1993, Mar. 15, 1993, pp. 1215–1217.
Diamond and Related Materials, May 1993, Switzerland, vol. 2, No. 8, ISSN 0925–9635, pp. 1197–1202.
Tenth International Conference on Crystal Growth, Aug. 1992.

*Primary Examiner*—Archene Turner
*Attorney, Agent, or Firm*—Pillsbury Madison & Sutro LLP

[57] ABSTRACT

A diamond wafer including a substrate and a (111) oriented polycrystalline diamond film grown on the substrate for making surface acoustic wave devices, semiconductor devices or abrasion-resistant discs. The (111) oriented film is produced by supplying a lower carbon concentration gas and a higher carbon concentration gas alternately. The lower carbon concentration means 0% to 1% of the atomic ratio C/H. The higher carbon concentration means 1% to 8% of the atomic ratio C/H. More than 40% of layered defects are either parallel with or slanting at an angle less than 5 degrees to the surface. The wafer is monotonously distorted with a distortion height H satisfying $2\ \mu m \leq |H| \leq 150\ \mu m$. The film is polished to a roughness of less than Rmax50 nm and Ra20 nm.

5 Claims, 8 Drawing Sheets

WAFER AND METHOD OF PRODUCING A WAFER

This is a division of Application Ser. No. 08/480,786, filed Jun. 7, 1995, now U.S. Pat. No. 5,736,226.

FIELD OF THE INVENTION

This invention relates to a diamond wafer which is suitable for a material of surface acoustic wave devices, thermistors, substrates of semiconductor devices, pressure-resistant discs, disc protection films or X-ray windows, and a method of producing the diamond wafer.

Diamond is favored with a high sound velocity which is determined by the ratio of the Young modulus to the density. Then the velocity of the surface acoustic wave is extremely high. Diamond is a promising substrate material of surface acoustic wave devices (SAW). SAWs include SAW filters, SAW phase shifters and SAW convolvers. This is an application of diamond as an insulator which makes the best use of the high rigidity and the low specific gravity of diamond.

Diamond can be converted into a semiconductor with a considerably low resistivity by doping impurities. Diamond has excellent properties also as a semiconductor. Therefore, diamond is a much promising material. Diamond would be utilized for various purposes in future.

However, wide diamond wafers have never been produced yet. Thus the devices which make use of diamond have scarcely been produced in practical scale yet. The lack of a wide diamond wafer prevents the fabrication of diamond devices. Wide single crystal diamond wafers have been requested.

BACKGROUND OF THE INVENTION

This application claims the priority of Japanese Patent Application NO.6-152701 (152701/1994) filed Jun. 9, 1994 which is incorporated herein by reference.

Diamond as a natural resource has suffered from a poor yield. Natural diamond crystals are small. If natural diamond crystals were sliced and polished, no wide wafers would be obtained. There is no probability of producing wide diamond wafers from natural diamond crystals. Bulk diamond crystals can be synthesized by an ultra-high pressure method which makes a diamond crystal from solid carbon under an ultra-high pressure at a high temperature. But such synthesized diamond is small granules. The ultra-high pressure method cannot produce big bulk diamond crystals. The ultra-high pressure diamond is a lump. The lump of diamond should be polished in order to make a thin disc (wafer). The polishing of diamond is, however, very difficult, since diamond is the hardest material. Polishing a diamond lump into a thin diamond plate Is nearly impossible from the standpoint of cost, because the polishing will enormously consume time and polishing medium. If a bulk diamond could be polished, a thin plate would be too narrow to make a plenty of devices on the diamond plate. Industrial applications of diamond are subject to wide wafers.

Another synthesis of diamond is CVD methods. The CVD methods can make a diamond film on a suitable substrate from a vapor phase instead of bulk, lump crystals. The CVD methods supply hydrogen gas and a hydrocarbon gas to a heated substrate, excite the gases by heat, discharge or microwave, induce chemical reactions and pile carbon atoms into the diamond structure on the heated substrate.

There are some different CVD methods classified by the differences of exciting the material gas. A hot filament CVD method, a microwave plasma CVD method, a radio-frequency plasma CVD method, a DC plasma jet method and so on have been known for the methods of making a diamond film.

THE PROBLEMS TO BE SOLVED

Application of diamond to electronics devices is subject to the production of wide diamond wafers. The brilliant success of silicon semiconductor technology depended on the collective treatment through wafer processes on wide wafers (8-inch wafers, 10-inch wafers or so) and the mass production of a plenty of equivalent devices on the same wafer in a single lot. If diamond is applied as a substrate material for electronic devices, optoelectronic devices or optical devices, at least 1-inch diamond wafers should be required. 2-inch wafers, 3-inch wafers or more than 3-inch wafers will be preferable. More than 3-inch wafers would be still more convenient. However, the ultra-pressure method capable of synthesizing homogeneous diamond would be unable to make such a big bulk diamond with a 1-inch diameter still in future. Thus, there would be no possibility of making even a 1-inch homogeneous wafer.

On the contrary, the progress of the vapor phase synthesis (CVDs) enables to produce a wide diamond film on a pertinent substrate. The complex, inhomogeneous wafers instead of the homogeneous wafers, produced by the CVD methods may be used as a diamond wafer, because electronic devices generally use only the surface of wafers. Thus, the complex wafers are promising.

Nevertheless, even if wide-area wafers can be made, these wafers are still useless as they are, because the surface of the diamond films is quite rugged. The CVD methods cannot make smooth-surfaced films, since they pile the results of reaction from vapor phase on a substrate. The perturbation of the surface morphology becomes more conspicuous for thicker films. A thin film is almost immune from the disorder of the surface structure, as the smoothness of the substrate is simply transcribed to the surface of the film.

The surface of the wafers must be flat and mirror-smooth in order to make devices by photolithography on the wafers. If the surface of wafers is not mirror-smooth, optical means cannot depict exact patterns on the wafers. The mirror-flat surface is indispensable for the wafers as the substrates of making devices thereon. Then the diamond films grown on a substrate must be polished so as to obtain the mirror-smooth surface.

The CVD methods can produce a wide area film on a substrate. Thin films with a thickness less than 1 $\mu$m have generally been produced on a substrate till now. Thin films cause no mechanical problem on the wafers. When the CVD methods yield a thick film on a substrate, however, the complex wafer Is distorted into a convexity or into a concavity by the generation of inner stresses caused by the difference of thermal expansions between the film and the substrate. The distortion causes a big problem to the complex wafer, because the distortion Impedes the polishing of the film. The deformation of the wafers prevents the manufacturers from finishing the diamond film into the roughness (or the smoothness) suitable for the applications to the electronic devices. If deformed wafers are forcibly polished by a conventional machine, either only a small portion is polished with wide unpolished parts left or the wafer itself is broken.

When thin diamond films (about or less than 1 $\mu$m) have been produced by the CVD methods, the films have not been polished till now in general, since they are very thin and smooth enough for the conventional uses, for example, cutting tools, abrasion-resistance tools and so forth. The problems of the distortion or the orientation have never been revealed. The substrate materials for electronic devices are a novel application of diamond. The application to the substrate material is subject to mirror-flat surfaces. Thus, the polishing is inevitable for making use of the diamond complex wafers as the substrates of electronic or optoelectronic devices. Thick films invite the distortion of the wafers due to the strong inner stress. Distorted wafers must be polished in order to adopt the wafers as the materials of electronic devices. Another problem Is the orientation of the diamond crystals. The problem of the orientation originates from the necessity of polishing itself.

Conventional diamond growth by the CVD methods is the production of polycrystalline diamond. A polycrystal includes various shapes, orientations or sizes of monocrystal granules. Therefore, conventional methods have made polycrystal diamond films in which the orientations of monocrystals are fully directed in various directions at random. Conventional methods could not make single crystal films of diamond.

A single crystal film is specified by the plane orientation of the surface. A (klm) single crystal means that surface of the film is (klm)-plane, where k, l and m are plus or minus integers which are collectively called plane indices or Miller indices. A normal which is a line orthogonal to the surface is directed in <klm>-direction. A single crystal can be fully specified by the Miller indices. No Miller index can specify a polycrystal, because the polycrystal contains many, small granules with various Miller indices. "Polycrystal" is an antonym of "single crystal" or "monocrystal". A solid material can, however, take an intermediate crystallographical state, that is, an "oriented crystal" between a polycrystal and a single crystal. The oriented crystal means that almost all the polycrystalline granules have the same plane indices in the surface. Namely, (klm)-oriented crystal means that almost all the individual crystals have <klm>direction in the direction normal to the surface of the film. Other 2-dimensional directions parallel with the surface are, however, still at random for individual crystals unlike a single crystal. Only one crystallographical direction is in common for the polycrystalgranules. The substrate plays the role of aligning the granules in the direction of the normal. The oriented crystal is capable of being defined to a film crystal formed on a substrate.

An oriented crystal is also specified by a plane index (klm) just like a single crystal. But it should be noted that a single crystal and an oriented crystal are different from each other in the significance of the plane index (klm). The oriented crystal is named, for example, by a (111) orientation film, a (110) orientation film or a (100) orientation film. Here (klm) is a collective index including ±k, ±l, and ±m. (111), (−111), (1−11), (11−1), (−1−11), (1−1−1) and (−1−1−1) are equivalent and are commonly represented by the (111) orientation.

A (111) orientation film excels in a crystallographical property. The (111) orientation film may supply the most suitable surface on which devices are fabricated, if electronic devices or optoelectronic devices are produced by the diamond wafers. The (111) oriented surface, however, has a drawback of the frequent occurrence of stacking faults and twins. Another drawback of the (111)oriented film is a big distortion. Nobody has known how to deposit a low-distorted, highly-ordered (111)oriented film on a substrate. Even if a (111)oriented film were produced, it would still be annoyed by the difficulty of polishing because of the extreme hardness of (111) orientation. Since an as-grown (111) oriented film has quite rugged a surface, it is impossible to make devices on the (111) oriented film by the wafer processes without being polished. Polishing of diamond is likely to lead to an occurrence of chipping (microscopic break). The chipping or microscopic break of diamond film makes it impossible to fabricate a diamond wafer which suffices the requirement of roughness.

Recent development has brought about diamond films having considerably flat surfaces by orientating the polycrystalline diamond. The surfaces of the oriented diamond are not so smooth as a mirror yet. Mirror wafers are indispensable for fabricating electronic devices. Mirror-polishing of diamond wafers without chipping has been ardently desired in order to utilize diamond films as a substrate of electronic or optoelectronic devices. The occurrence of chipping may be suppressed by contrivances of the conditions of polishing. The Inventors have found that the occurrence of chipping can be reduced by controlling the diamond film itself.

Despite the drawbacks, the (111) oriented film shall be the most appropriate film for fabricating electronic, optoelectronic or optical devices on it by the wafer processes, because of the excellent crystallographical property.

Difficulties, however, accompany the (111) oriented film. One difficulty is the problem of production. The other is the difficulty of polishing. Namely, nobody has known yet how to make (111) oriented films or how to polish the (111) oriented film. How can a (111) oriented film be selectively grown on a substrate? How can the (111) oriented film be polished to mirror flatness.

OBJECTS AND SUMMARY OF THE INVENTION

An object of the present Invention is to provide a smooth, flat (111) oriented diamond-coated wafer which will be utilized as a substrate material for surface acoustic wave devices, semiconductor devices or abrasion-resistant discs.

Another object of the present invention is to provide a smooth, flat (111)oriented diamond-coated wafer having a roughness of less than Rmax50nm and less than Ra20nm.

A further object of the present invention is to provide an as-grown (111) oriented diamond-coated wafer having a distortion ranging from $-2 \mu m$ to $-150 \mu m$ or ranging from $+2 \mu m$ to $+150 \mu m$.

A further object of the present invention is to provide a method of growing a (111) oriented diamond film by controlling defects.

A still further object of the present invention is to provide a method of polishing'the (111) oriented diamond wafer into a roughness of less than Rmax50nm and less than Ra20nm.

The diamond wafer of this Invention has a substrate and a (111) oriented polycrystalline diamond film being synthesized on the substrate by a CVD method and being polished to a roughness of less than Rmax50nm and Ra20nm. The wafer is monotonously deformed either into a convex-shape or into a concave-shape with a distortion height H of $2 \mu m \leq |H| \leq 150 \mu m$. Preferably, $-150 \mu m \leq H \leq -2 \mu m$ or $+2 \mu m \ \mu m \leq H \leq +50 \mu m$. The shape of the wafer is circular, rectangular, square etc. A circular wafer often has an orientation flat (OF) or an index flat (IF) on the periphery.

A suitable substrate is a Si single crystal wafer, a GaAs crystal wafer, an AlN crystal wafer, a $LiNbO_3$ wafer, a $LiTaO_3$ wafer, a quartz wafer or so. The wafer should have more than one inch diameter. Suitable thickness of the substrate is from 0.1 mm to 1mm. The substrate should preparatively be bruised to a roughness of Ra5nm to Ra100nm for enhancing the density of nucleus generation of diamond.

The most important matter of the invention is the adoption of the (111) orientation of the diamond polycrystal. Stacking defects (faults) and twins occur in parallel with the {111} planes. Thus, stacking faults and twins may be called layered defects. The layered defects arise mainly in parallel with the {111} planes. Inherently {111} planes are cleavage planes. Thus, {111} planes are likely to cleave. Furthermore, the planes having such defects are liable to cleave, since the defects reduce the coupling forces in the planes.

The {111} planes include four equivalents planes of (111), (−111), (1−11) and (11−1). Each individual plane exists with a ratio of 25 % in a diamond crystal. The four kinds of {111} planes meet at 70 degrees with each other. One of the {111} planes is parallel to the surface of the substrate. Three other kinds of the {111} planes incline at 70 degrees to the surface. Thus, stacking faults and twins, layered defects, are distributed in the same-probability in the {111} planes in a diamond film. The parallel defects which are parallel with the surface occupy 25 % of the total layered defects. The non-parallel defects which are not parallel with the surface are 75 % of all the layered defects.

The Inventors have investigated more than ten thousand chippings of diamond films occurring in polishing and have found out the fact that the roles of the {111} oriented layered defects are different in the occurrence of chipping or micro-breaks of a diamond film in polishing.

The non-parallel layered defects induce deep chipping on a diamond surface, when the diamond film is mechanically polished. The parallel defects, however, invite little chipping. Even when a parallel defect raises a chipping, the depth is very shallow. Namely, the non-parallel defects have a bad influence on the diamond surface, but the parallel defects have no bad effect on the surface. 75% of the layered defects are naturally non-parallel defects in a non-regulated (111) oriented diamond. The Inventors have discovered the fact that although the sum of all the layered defects is not changed, the non-parallel defects can be suppressed by increasing the parallel defects. A contrivance of vapor phase synthesis is capable of increasing the number of the parallel layered defects and decreasing the number of the non-parallel layered defects. This invention adopts such a regulated (111) oriented diamond which has less than 60 % of the non-parallel defects. Then In the present invention, the ratio of the non-parallel defects is 15% lower than in the non-regulated (111) oriented crystal. The reduction of the non-parallel defects decreases the probability of the occurrence of chipping.

The problem is now reduced to the question how to kill the non-parallel defects. The inventors have found that the (111) oriented diamond with little non-parallel defects can be produced by starting the vapor phase synthesis with a low carbon concentration gas and changing the carbon concentration of the gas periodically. This invention cyclically uses a lower carbon concentration gas "U" and a higher carbon concentration gas "W". The ratio "X" (C/H) of the carbon atom number C to the hydrogen atom number H shall be 0 % to 1% in the lower carbon concentration gas U. The ratio "Y" (C/H) of the carbon atom number C to the hydrogen atom number H shall be 1% to 8% in the higher carbon concentration gas W.

"a" denotes a time interval of supplying the lower carbon concentration gas, and "b" designates a time interval of supplying the higher carbon concentration gas. The ratio (a/(a+b)) of the time interval a of supplying the lower carbon concentration gas U to the total period (a+b) is more than 50 %. The ratio (b/(a+b)) of the time interval b of supplying the higher carbon concentration gas is, of course, less than 50%. The synthesis shall be begun with the lower carbon concentration gas U and shall vary the material gas from gas U to gas W and from gas W to gas U periodically.

The material gas usually consists of hydrogen gas and a hydrocarbon gas. All or a part of the hydrogen gas can, however, be replaced by rare gases, e.g. argon gas, neon gas, etc. Hydrocarbon gas can also be replaced by an organic or inorganic gas containing carbon atoms. Besides, the material gas can contain an organic or inorganic gas including oxygen atoms for improving the surface state of the film.

This invention also polishes the diamond films uniformly till a roughness less than Rmax50 nm and less than Ra20 nm, which enables the electrode formation, the impurity implantation, the impurity diffusion, or the selective etching by photolithography.

DETAILED DESCRIPTION OF THE PREFERRED EMBODIMENTS

Figure 1:
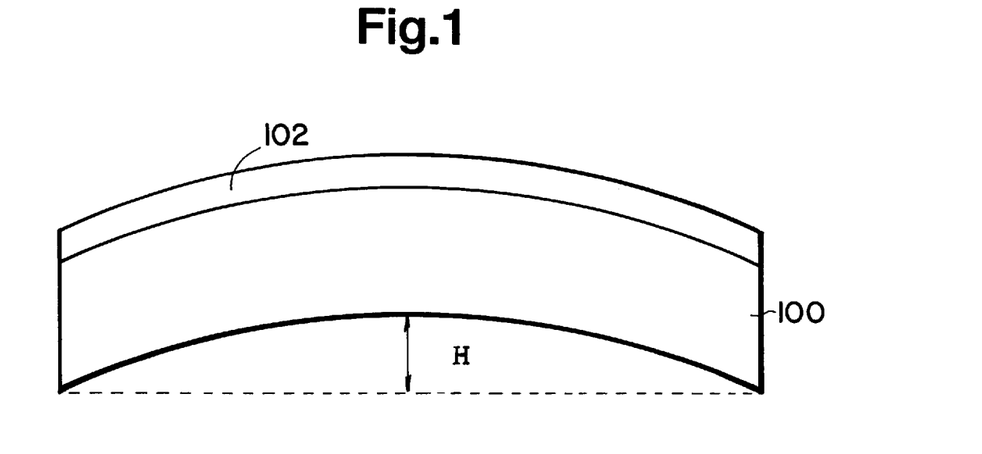
FIG. 1 is a simplified section of a convex-distorted complex wafer for showing the definition of the distortion H.

FIG. 1 indicates a section of a complex diamond wafer produced by the present invention. The complex wafer consists of a substrate of a softer material and a diamond film grown on the substrate. The film is grown at a high temperature by the CVD method. Inner strain originates from the difference of the thermal expansions between the substrate and the diamond film, when the wafer is cooled down to room temperature. The inner strain transforms the wafer either into a convex-shape or into a concave-shape on the film side. The former is called a convex-distortion. The latter is called a concave-distortion. The degree of the distortion is expressed with the height "H" of the center from the plane including the circumference of the wafer. H is positive for the concave-distortion and H is negative for the convex-distortion. FIG. 1 shows an example of the convex-distortion (H<0). This invention requires the absolute value of the distortion H between 2 μm and 150 μm for the complex wafer after the synthesis. The requirement includes both the convex-distortion and the concave-distortion within the range. This invention is explained item by item with regard to the diamond films, the substrates and the distortions.

[A. diamond films]

The diamond film must be (111)-oriented on the substrate. Namely, most grains have a (111) plane parallel to the surface of the substrate. Random oriented polycrystal is useless in the present invention. In addition to being oriented in (111) direction, more than 40 % of the layered defects must be the parallel defects which have the (111) plane in parallel with the surface.

The crystallographical structure is examined by the X-ray diffraction measurement. The diamond films are examined by the 2θ-θ scanning by an X-ray diffraction apparatus.

A (111) orientated film signifies that the power of the diffracted X-rays is the biggest in (111) planes.

The general diffraction patterns of X-rays from bulk polycrystalline diamond are given by the ASTM (American Society for Testing Materials) card. According to the ASTM, the diffraction peak height ratios from (111) planes, (220) planes, (311) planes, (400) planes and (331) planes are 100, 27, 16, 7 and 15 which are normalized by the intensity of (111) diffraction as 100.

TABLE 1

ASTM CARD
X-RAY DIFFRACTION PATTERN FROM
POLYCRYSTALLINE DIAMOND

| planes | (111) | (220) | (311) | (400) | (331) |
|---|---|---|---|---|---|
| diffraction peak height | 100 | 27 | 16 | 7 | 15 |

If the relative ratios of X-ray diffraction from the (220), (311), (400) and (331) planes are smaller than the cited values i.e., 27, 16, 7 and 15, the film can be safely identified to be a (111) oriented film. The crystallographical property and the orientation cannot be estimated only by the ratios of diffraction power from the planes. Twins and stacking faults (stacking defects) are likely to grow in the CVD made (111) film. The occurrence of the layered defects often induces the fluctuation of several degrees of the orientation. The fluctuation of the orientation invites the distortion in the film crystal and degrades the crystallographical property. Therefore, another criterion is required for estimating the properties of a (111) oriented diamond film in addition to the relative heights of peaks of non-(111) plane diffraction.

Another criterion this invention adopts for judging the properties of the film is the sharpness of the peak of the (111) diffraction. The sharpness of the peak can be in practice estimated by the FWHM (width of the peak at half height of the maximum). Then, if the diffraction from (111) planes is dominant and the FWHM of the peak is less than 20° when 2θ is set to the angle of the (111) plane diffraction, the film is safely judged to be (111) oriented. At the same time, the sharp peak of (111) less than 20 degrees means that more than 40 % of the layered defects (stacking faults and microtwins) are parallel defects which have the layers parallel with or slanting at most at 5 degrees to the surface of the film.

More than 20° of the FWHM of the (111) peak in the locking curve means a bad crystallographical property of the film and the incompetence for the wafers of electronic devices. In concrete, the propagation loss of signals is very large when an SAW device, e.g. an SAW filter is produced on the wafer of the (111) FWHM more than 20°. The films are judged whether they are (111) oriented or not, by two conditions of the peak height of (111) diffraction and of the narrowness of the (111) peak.

Figure 2:
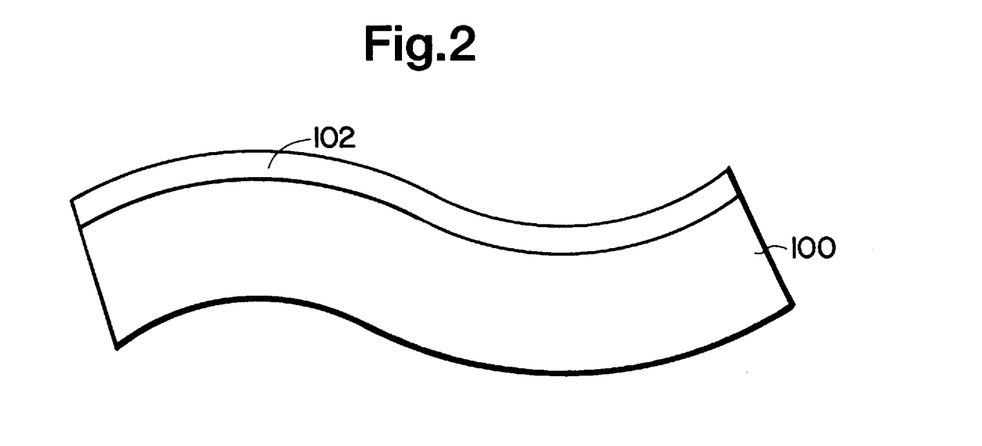
FIG. 2 is an exaggerated section of a flat complex wafer.

There are other difficulties for the films which are not (111) oriented. The distortion is likely to exceed 200 μm in the non-(111) oriented films owing to the big inner strain. The distortion is random or non-uniform. The wafers are liable to bend into a complicated curve with some deflections, e.g. an S-curve and a W-curve in the section, as shown in FIG. 2. Such a wavy wafer cannot be entirely polished. On the contrary, the wafers having a (111) oriented film have a comparatively small and simple distortion less than 200 μm in absolute value. Thus, (111) orientation is optimum for the diamond complex wafers.

[B. Substrates (Base discs)]

Suitable substrates of making a defect-regulated (111) oriented diamond film are wafers of Si, GaAs, GaP, AlN, SiC, $Si_3N_4$, $LiTaO_3$, $LiNbO_3$, quartz, and so on. In particular, Si wafers are preferable among these materials. A (111) Si wafer is the most suitable in variously-oriented Si wafers. A (111) Si wafer has a function of orientating a diamond film in (111) direction.

The suitable thickness of the substrate is contingent on the material. In general, an appropriate thickness is from 0.1 mm to 1 mm. A substrate thinner than 0.1 mm may be deformed seriously and may be broken during the diamond film synthesis. By contrast, a substrate thicker than 1 mm is inconvenient, because such a thick wafer cannot be treated by the present wafer processes. Thus, devices cannot be made on the thick substrate.

The shape of substrate is arbitrary, e.g. rectangular, square or circular. A circular substrate is the most convenient for handling it in the device-making processes. The diameter is also arbitrary. A diameter longer than 1 inch is desirable for the efficiency in the wafer processes. 2-inch, 3-inch, 4-inch, 5-inch or 8-inch diameter of substrates is available.

[C. Material Gas]

The defect-regulated (111) oriented polycrystalline diamond film having a FWHM less than 20 degrees can be produced by changing the carbon concentration in the material gas periodically. Typically, such a film can be grown by supplying a lower carbon concentration gas U and supplying a higher carbon concentration gas W in turn. The carbon/hydrogen atomic ratio X (C/H) of gas U is between 0 at% and 1at %. The carbon/hydrogen atomic ratio Y (C/H) of gas W is between 1 at% and 8 at %.

$$0 \text{ at\%} \leq X = C/H \leq 1 \text{ at\%}. \tag{1}$$

$$1 \text{ at\%} \leq Y = C/H \leq 8 \text{ at\%}. \tag{2}$$

If the CVD method adopts methane as a hydrocarbon gas, the same mol ratios of gas U and W are reduced to;

$$0 \text{ mol\%} \leq CH_4/H_2 \leq 2 \text{ mol\%} \tag{3}$$

$$2 \text{ mol\%} \leq CH_4/H_2 \leq 16 \text{ mol\%}. \tag{4}$$

The earliest gas to be supplied is the lower carbon concentration gas U. Then gas U and gas W shall be periodically replenished into the reaction chamber.

Here "a" and "b" denote the time interval of supplying gas U and the time interval of supplying gas W. A period of gas supply T is T=a+b. The interval a is longer than b. Thus the ratio a/T of gas U supplying time to T shall be equal to or more than 50%. The time ratio b/T shall be equal to or larger than 1 %. In other words, the ratio b/(a+b) and a/(a+b) are simply given by inequalities, $$0.01 \leq b/(a+b) = b/T \leq 0.5. \tag{5}$$

$$0.5 \leq a/(a+b) = a/T \leq 0.99. \tag{6}$$

In addition to the two level concentrations of carbon, three or four levels of carbon concentration are also allowed. In the variation, the gas must satisfy the inequalities (1) to (6).

The reciprocation of changing the carbon concentration in the material gas enables the synthesis to make a (111) oriented film in which more than 40 % of the total layered defects align in parallel with the film surface or are slanting within +5 degrees to the film surface. Namely, more than 40% of the defects are parallel defects which invite little bad effect on the film surface in mechanical polishing. (fgh) denotes the plane direction of a layered defect (microtwin or stacking fault). (111) denotes the surface of the film. The inclination angle Θ between the surface and the layered defect is given by $$\Theta = cos^{-1}(f+g+h)/\{3(f^2+g^2+h^2)\}^{1/2}. \tag{7}$$

The parallel layered defects are defined by an inequality $$-5° \leq \Theta \leq +5°. \tag{8}$$

The non-parallel layered defects are defined by another inequality;

$$-90° \leq \Theta \leq 5° \text{ or } +5° \leq \Theta < +90°. \tag{9}$$

Figure 16:
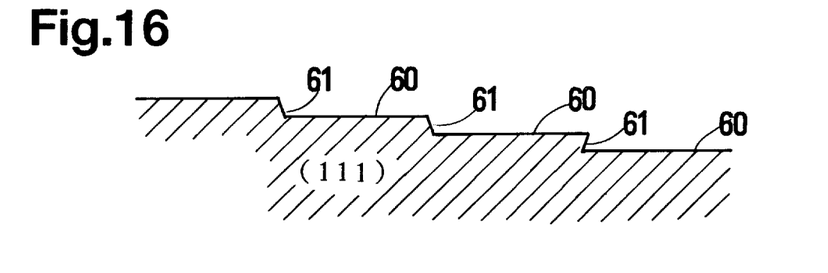
FIG. 16 is a sectional view of a growing diamond film which has flat terraces of (111) orientation and edges of a single atomic layer depth.
Figure 17:
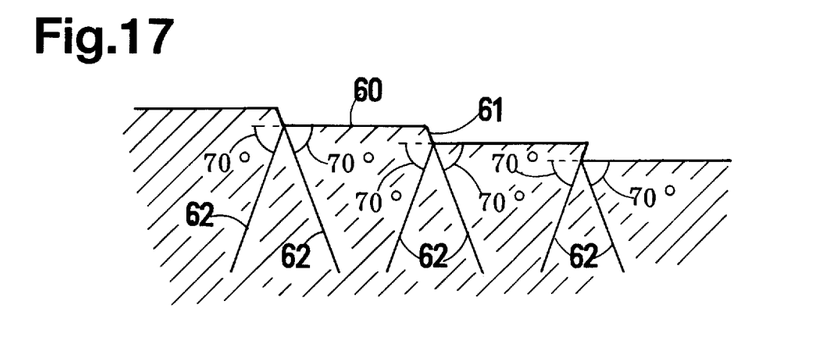
FIG. 17 is a sectional view of a growing diamond film which has the flat terraces, the edges and layered defects growing from the edges.

A (111) oriented diamond film can be grown at higher temperature by supplying lower carbon concentration material gas in a CVD method. FIG. 16 denotes a section of growing diamond film by the higher temperature, lower carbon CVD. Such a low carbon synthesis is likely to induce stepwise growth. The surface has many terraces (60) and edges (61). The terraces orient in (111) direction. The parallel layered defects are parallel with the terraces (60). Other non-parallel defects (62) are apt to grow from the edges (61) in the direction of 70 slanting degrees, as shown in FIG. 17.

If the material gas were maintained at the low carbon concentration, the non-parallel defects (62) would further develop in the slanting directions, since the growth continues at the edges (61) (edge-growth). Thus, the non-parallel defects (62) would occupy 75% of the total defects. Namely, gas U can produce a (111) oriented diamond film but cannot suppress the slanting growth of the defects (62) from the edges.

Figure 18:
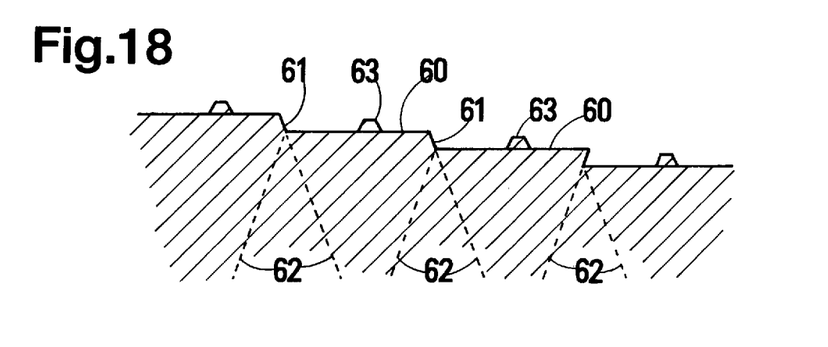
FIG. 18 is a sectional view of a growing diamond film which has the flat terraces, the edges, the layered defects and isolated nuclei epitaxially grown on the terraces.
Figure 19:
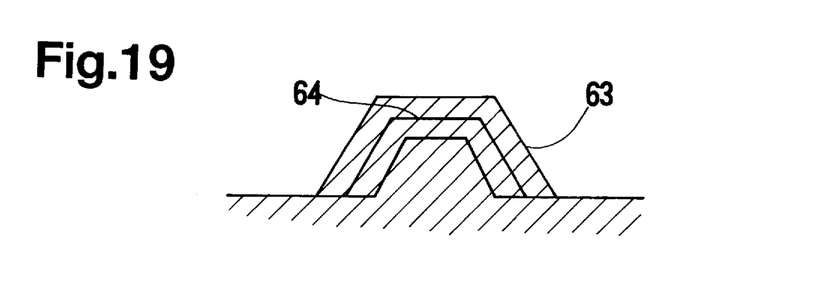
FIG. 19 is a sectional view of a growing nucleus having a layered defect parallel with the surface of the film.

In order to prevent such an isotropic development of the defects, this invention periodically supplies a higher carbon concentration gas W. Gas W makes a plenty of free nuclei (63) on the terraces (terrace-growth), as shown in FIG. 18. Gas W has no power to make (111) oriented grains inherently. In this case, (111) oriented nuclei are epitaxially yielded on the terraces by gas W, since the undercoating terrace (60) has been (111) oriented due to the previous supply of gas U. The generation of the on-terrace nuclei (63) prevents the carbon atoms from depositing at the edges (61) and prohibits the defects from developing in the 70° slanting directions. The on-terrace nuclei (63) grow on the terraces (60) and produce parallel layered defects (64), as shown in FIG. 19. The layered defects (64) have a layered direction parallel with the surface or slanting within 5 degrees to the surface.

In short, the lower carbon concentration gas U has the role of making a (111) oriented film on a substrate and the higher carbon concentration gas W has the role of making parallel layered defects on the terraces positively and decreasing the number of the non-parallel defects.

[D. Distortion (deformation, strain)]

This invention requires a monotonous distortion of a complex wafer from the center to the periphery. Both a convex-distortion (negative H) and a concave-distortion (positive H) on the film side are allowable. A deflection point (at which the second order differentiation changes the sign + or −) should not exist in any section of the substrate. Monotonous convex-distortion (H<0) has a negative second order differentiation overall. Monotonous concave-distortion (H>0) has a positive second order differentiation overall.

The preferable absolute value of the distortion height H ranges from 2 $\mu$m to 150 $\mu$m. Here the distortion of a complex wafer is expressed with the height of the center from the plane including the circumference. The relation between the curvature and the height H is varied by the diameter of the substrate wafer. The curvature is different in the same height H, if the diameter is different. The height is the most suitable parameter for expressing the distortion, because the height of the center is easily measured. Thus, the distortion is represented by the height H. The aforementioned requirement is written as $2 \mu m \leq |H| \leq 150 \mu m$. More desirable scope of H is expressed by $3 \mu m \leq |H| \leq 50 \mu m$.

A flat, non-distortion wafer seems to be the most pertinent for polishing. This invention, however, denies flat, non-distortion wafers after the synthesis. A flat wafer without macroscopic distortion has a tendency of having a wavy surface having small convex portions and concave portions. The section of the wavy wafer has deflection points. The complexity of the wavy film prevents the polishing machine from polishing all the surface uniformly. Some parts are left unpolished or insufficiently-polished. Then this invention rejects flat wafers (H=0)

Therefore, even if the wafer is deformed by the deposition of the film, simpler distortion without deflection is far more desirable than the wavy, complicated deformation. The lower limit of the distortion is determined to 2$\mu$m in order to exclude flat wafers (H=0).

The upper limit is 150 μm. More than 150 μm of distortion is inappropriate, because a wafer having such a big deformation cannot fully be polished. Some portions are left unpolished, in particular, in the vicinity of the circumference. Thus, the wafers having a deformation bigger than 150 μm shall be excluded.

This invention is applicable both to the convex-distorted wafers and the concave-distorted wafers. But the convex-distortion is more suitable than the concave-distortion. The scope of distortion is represented by $-150\ \mu m \leq H \leq -2\ \mu m$. Further, the pertinent scope of the distortion is $-50\ \mu m \leq H \leq -3\ \mu m$.

[EXAMPLES]

Diamond wafers are produced by coating a diamond film on a substrate, polishing the film according to the present invention, forming interdigital electrodes on the film by evaporating aluminum film, selectively etching the film into parallel electrode patterns and examining the yield of the wire-cutting of the interdigital electrodes. FIG. 3 to FIG. 7 indicate the processes of the fabrication of films, the polishing of films and the formation of electrodes.

Figure 3:
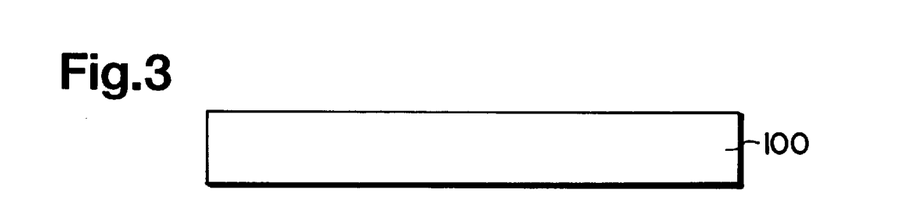
FIG. 3 is a section of a substrate at the first step of making a surface acoustic wave device.
Figure 4:
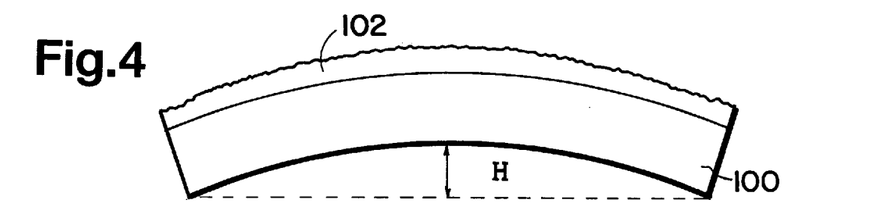
FIG. 4 is a section of a complex wafer having a substrate and a rugged diamond film grown on the substrate for showing the convex-distortion caused by the synthesis.
Figure 5:
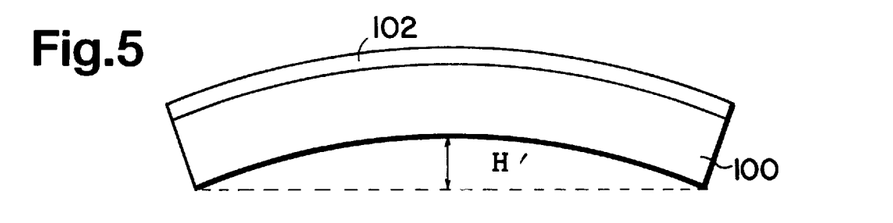
FIG. 5 is a section of a complex wafer having a substrate and a polished diamond film.

At first, flat and circular substrates are prepared, as shown in FIG. 3. Diamond films are made on the substrate from a material gas by the microwave plasma CVD method, the filament CVD method, the plasma jet CVD method and the burner method. The material gas includes hydrogen gas and a hydrocarbon gas. In the examples, the ratio ($CH_4/H_2$) of methane gas to hydrogen gas is 0 at% to 8 at% (0 mol% to 16 mol%). The pressure in the reaction chamber is 1 Torr (133 Pa) to 300 Torr ($4 \times 10^4$ Pa). Rugged diamond films are produced on the substrate, as shown in FIG. 4. The inner stress deforms the wafers. The rugged surface of the complex wafers is polished by a mechanical polishing machine. The surface becomes smooth enough but the distortion survives the polishing. FIG. 5 indicates the polished wafer. The orientation of the crystals on the diamond film is investigated by the X-ray diffraction method. In particular, the power ratio of the diffracted X-rays as a function of θ is measured in the 2θ–θ scanning. The locking curve of (111) planes is determined for all samples by the θ scanning, and the FWHM is measured from the locking curve.

Figure 6:
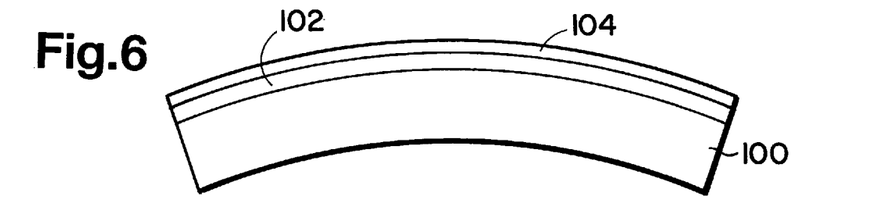
FIG. 6 is a section of a complex wafer having a smooth surface on which an aluminium layer is evaporated.
Figure 7:
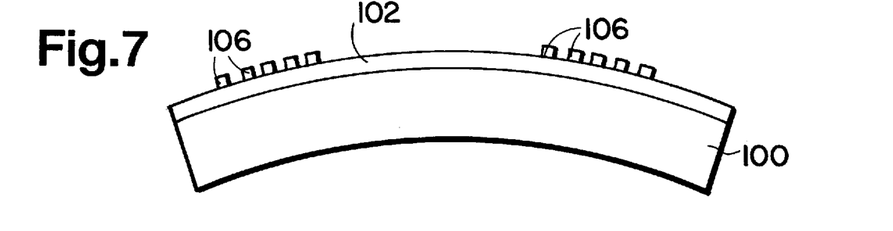
FIG. 7 is a section of a complex wafer on which aluminum interdigital transducers are formed.

An aluminum film is evaporated on the diamond film which is shown in FIG. 6. Fine wire patterns are formed by etching parts of the aluminum film by photolithography. These metal patterns compose parallel fine electrodes which build an interdigital transducer of a SAW device. The line width is varied from 0.6 μm to 2 μm. FIG. 7 shows the section of the wafer having the diamond film and the aluminum (interdigital transducer) electrodes. Then the yield against wire-cutting is investigated for the samples. Young modulus of the diamond films is also measured by the vibration lead method. The results are listed in Table 2,6,7,8 and 10.

This invention aims at making a defect-regulated (111) oriented film. For the purpose, at least two different gases are replenished into the reaction chamber cyclically. A lower carbon concentration gas U includes carbon atoms between 0 at% and 1 at% to hydrogen atoms. A higher carbon concentration gas W includes carbon atoms between 1 at% and 8 at% to hydrogen atoms. At first, gas U is supplied. Then gas W and gas U are replenished in turn. The repetition of changing the carbon ratio in the material gas makes the defect-regulated (111) oriented diamond.

Twelve samples are prepared, polished and examined for investigating the effect of this invention. Table 2 lists the substrate, the thickness of the substrate, the diameter of the substrate, the method of synthesis and the thickness of the grown diamond film in reference to all the samples.

TABLE 2

Substrate, substrate thickness, substrate diameter, synthesis method and film thickness

| NO | substrate | substrate thickness (mm) | substrate diameter (inch) | synthesis (CVD-method) | film thickness (μm) |
|----|-----------|--------------------------|---------------------------|------------------------|---------------------|
| 1  | Si (111)  | 1    | 2   | microwave | 30   |
| 2  | Si (111)  | 1    | 4   | filament  | 50   |
| 3  | Si (100)  | 0.35 | 8   | filament  | 100  |
| 4  | GaAs      | 0.1  | 1   | microwave | 15   |
| 5  | AlN       | 0.8  | 3   | filament  | 5    |
| 6  | LiNbO₃    | 0.5  | 2   | filament  | 30   |
| 7  | LiTaO₃    | 0.3  | 5   | microwave | 100  |
| 8  | Quartz    | 1    | 4   | filament  | 5    |
| 9  | Si (poly) | 0.05 | 2   | microwave | 150  |
| 10 | Si (poly) | 1    | 8   | filament  | 2    |
| 11 | LiNbO₃    | 3    | 0.5 | filament  | 1000 |
| 12 | GaAs      | 0.5  | 3   | microwave | 30   |

Samples 1 to sample 8 are embodiments of the present invention. Samples 9 to sample 12 are comparison examples. In the column of synthesis (CVD-method), "filament" means the filament CVD method, and "microwave" means the microwave plasma CVD method. The unit of the thickness of the substrate is "mm". The unit of the diameter is "inch" (25mm). The substrate discs are a Si(111) wafer, a Si(100) wafer, a GaAs wafer, an AlN wafer, a LiNbO₃ wafer, a LiTaO₃ wafer and a quartz wafer. The thickness of the substrate is dispersed between 0.05 mm and 3 mm. The diameter of the substrate is 0.5 inch (12.5mm) to 8 inch (200mm). The unit of the thickness of films is "μm". The diamond films have a thickness from 2 μm to 1000 μm.

Figure 8:
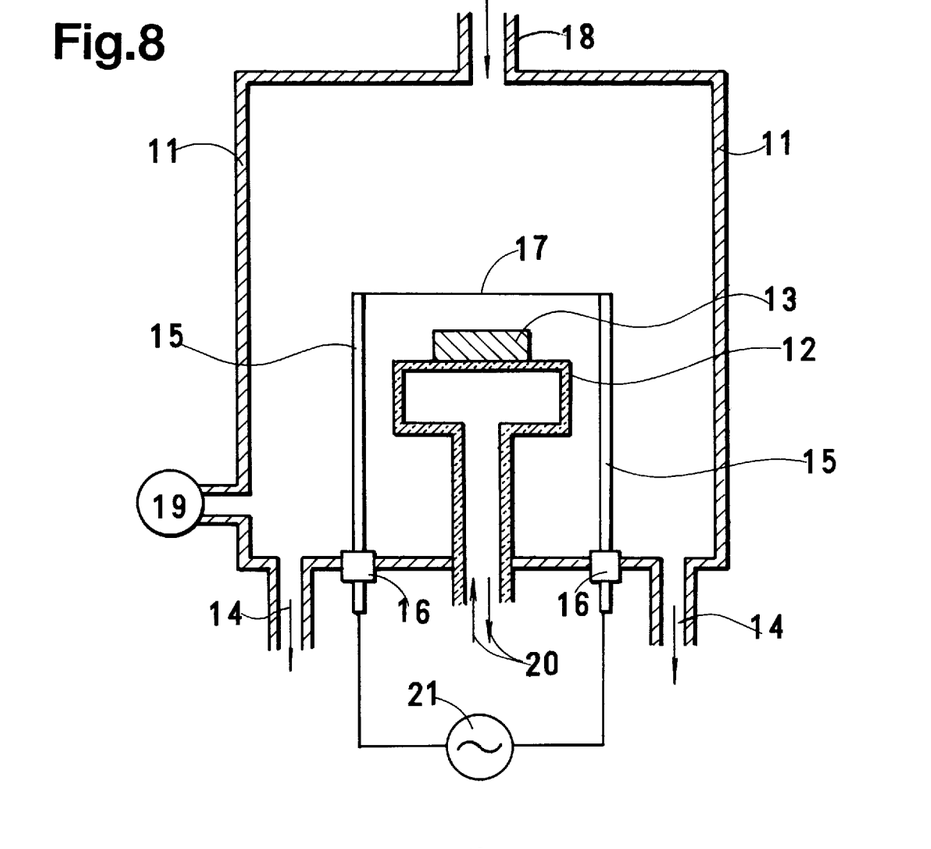
FIG. 8 is a sectional view of a filament CVD apparatus for synthesizing a diamond film on a substrate.

FIG. 8 indicates a filament CVD apparatus. A vacuum chamber (11) contains a susceptor (12). A substrate (13) is mounted on the susceptor (12). The vacuum chamber (11) has gas outlets (14) which communicate with a vacuum pump (not shown in the figure). Electrodes (15) stand in the vicinity of the susceptor (12). Filaments span the electrodes. A material gas containing hydrogen gas and a hydrocarbon gas is introduced through a gas inlet (18) into the chamber (11). A vacuum gauge (19) monitors the pressure in the chamber. The power source (21) supplies a current to the filaments and produces heat in the filaments. Then the substrate and the material gas are heated by the filaments. A coolant (20) circulates in the inner space of the susceptor (12) and cools the susceptor (12). The temperature of the susceptor (12) is kept at a constant value by controlling the ventilation of the coolant. The heat radiated from the filament excites the material gas and induces the vapor phase reaction. The reaction deposits the resultant material as a film on the substrate (13).

Figure 9:
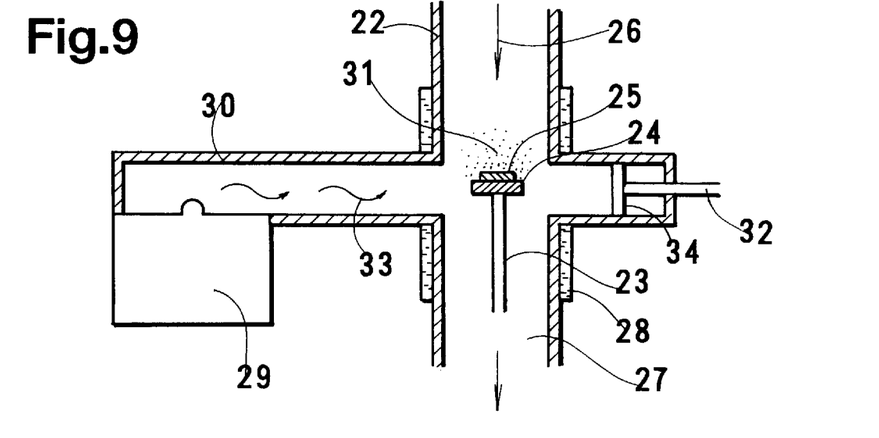
FIG. 9 is a sectional view of a microwave CVD apparatus for making a diamond film on a substrate.

FIG. 9 shows a microwave plasma CVD apparatus. A vertically elongate reaction chamber (22) has a susceptor (24) sustained by a shaft (23) at the center. A substrate (25) is positioned on the susceptor (24). A material gas (26) is replenished from a gas inlet at the top the chamber. The material gas passes by the substrate (25) and goes out of the chamber (22) through a gas outlet (27). The region in which plasma is produced is cooled by a cooling device (28) in which a coolant is ventilated. A magnetron (29) oscillates microwave (33). The microwave propagates in a vacuum waveguide (30) in the horizontal direction to the plasma region. Then the microwave (33) excites the material gas into plasma (31). The mode of the stationary wave of the microwave can be chosen by adjusting the position of a resonant plate (34) which is driven by a piston (32).

The synthesis of the diamond films is generally carried out by the steps of setting a substrate on a susceptor in a reaction chamber, heating the substrate, supplying a material gas into the reaction chamber, exciting the material gas by heat, microwave, RF-discharge or DC-discharge, inducing a chemical reaction and piling the result of the reaction on the heated substrate. The material gas contains hydrogen gas and a hydrocarbon gas.

Figure 20:
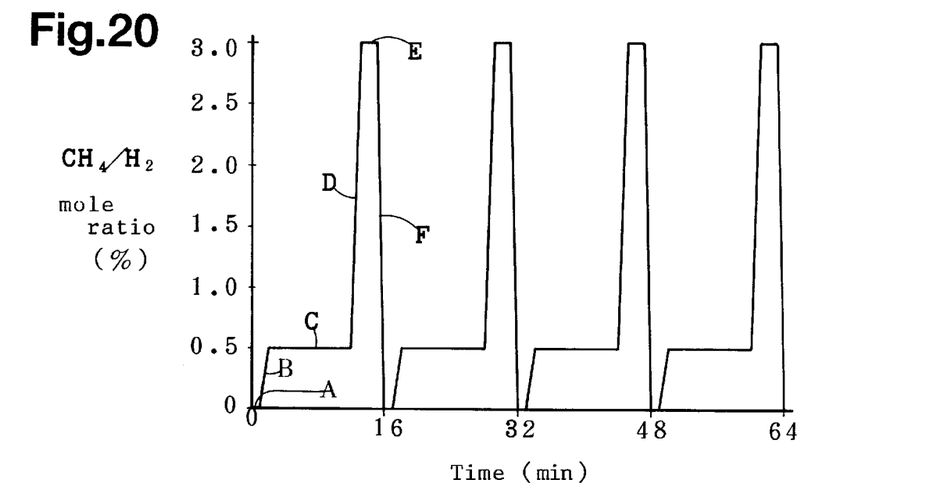
FIG. 20 is a time-dependent change of the carbon concentration in the material gas of mode ①.
Figure 21:
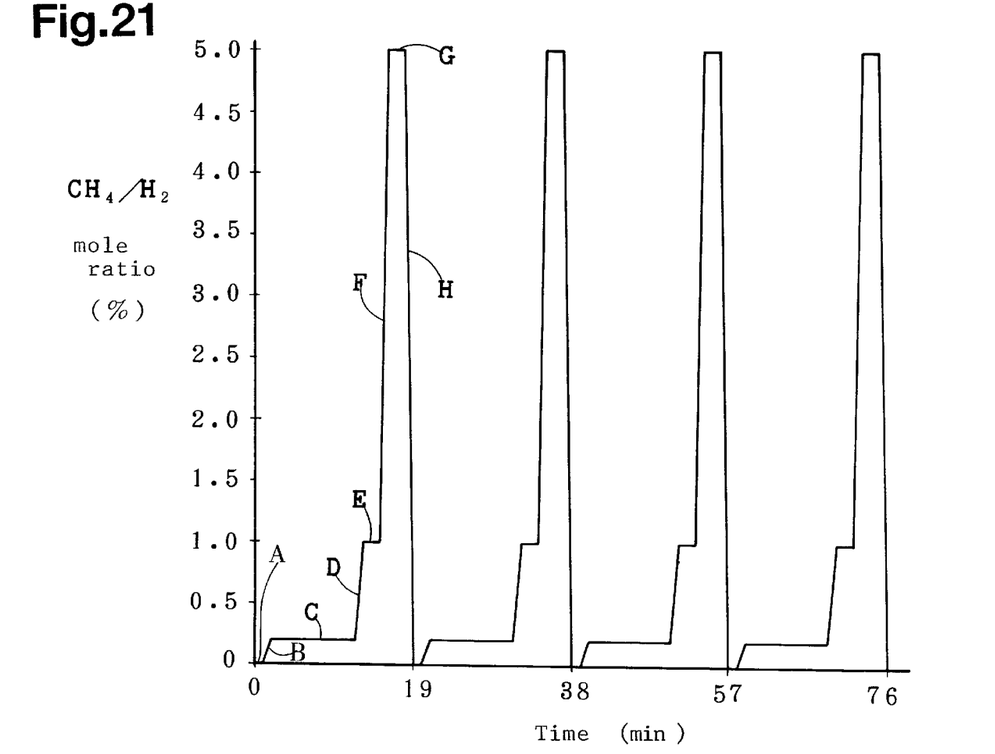
FIG. 21 is a time-dependent change of the carbon concentration in the material gas of mode ②.
Figure 22:
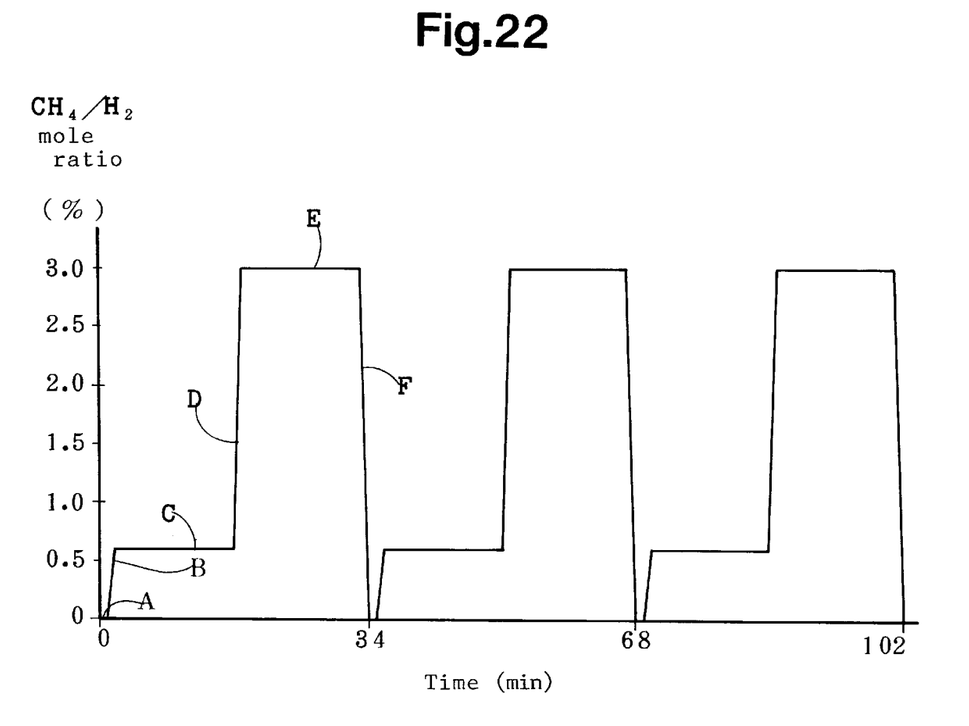
FIG. 22 is a time-dependent change of the carbon concentration in the material gas of mode ③.

As clarified before, the generation of low-distortion (111) oriented crystals requires a cyclic change of the ratio of hydrocarbon to hydrogen between a lower ratio X (0 at %≦X≦at %) and a higher ratio Y (1 at %≦Y ≦8 at %). Thus, the embodiments, samples 1 to 8, are made by changing the material gas in three modes ①, ② and ③ which are specified in the following lists. A,B,C, . . . means individual steps in a period T. Time intervals of these steps are denoted together. The mol ratio $CH_4/H_2$ is twice of the atomic percent X or Y of C/H. FIG. 20, FIG. 21 and FIG. 22 indicate the time-dependent changes of the carbon concentration in the material gas in modes ①, ② and ③. The period of a cycle is 16 minutes, 19 minutes and 34 minutes for modes ①, ② and ③. One synthesis repeats a plenty of the cycles for making a film of a desired thickness.

TABLE 3

Mode ① (FIG. 20) : Steps, intervals and C concentration

| Steps | A | B | C | D | E | F | T |
|---|---|---|---|---|---|---|---|
| Time (min) | 1 | 1 | 10 | 1 | 2 | 1 | 16 |
| $CH_4/H_2$ (%) | 0 | 0→0.5 | 0.5 | 0.5→3 | 3 | 3→0 | |

TABLE 4

Mode ② (FIG. 21): Steps, intervals and C concentration

| Steps | A | B | C | D | E | F | G | H | T |
|---|---|---|---|---|---|---|---|---|---|
| Time (min) | 1 | 1 | 10 | 1 | 2 | 1 | 2 | 1 | 19 |
| $CH_4/H_2$ (%) | 0 | 0→0.2 | 0.2 | 0.2→1 | 1 | 1→5 | 5 | 5→0 | |

TABLE 5

Mode ③ (FIG. 22): Steps, intervals and C concentration

| Steps | A | B | C | D | E | F | T |
|---|---|---|---|---|---|---|---|
| Time (min) | 1 | 1 | 15 | 1 | 15 | 1 | 34 |
| $CH_4/H_2$ (%) | 0 | 0→0.6 | 0.6 | 0.6→3 | 3 | 3→0 | |

Table 6 indicates the synthesizing conditions of the diamond films of samples 1 to 12. The comparison examples are made from a material gas containing methane having a constant ratio.

TABLE 6

Conditions of synthesizing diamond films

| NO | total flux of material gas (cc/m) | ratio of methane to hydrogen ($CH_4/H_2$) vol % | pressure (Torr) |
|---|---|---|---|
| 1 | 1500 | Mode ① 0→0.5→3→0→ | 20 |
| 2 | 1000 | Mode ① 0→0.5→3→0→ | 100 |
| 3 | 600 | Mode ② 0→0.2→1→5→0→ | 300 |
| 4 | 200 | Mode ① 0→0.5→3→0→ | 60 |
| 5 | 1000 | Mode ① 0→0.5→3→0→ | 1 |
| 6 | 800 | Mode ② 0→0.2→1→5→0→ | 70 |
| 7 | 200 | Mode ② 0→0.2→1→5→0→ | 250 |
| 8 | 50 | Mode ③ 0→0.6→3→0→ | 200 |
| 9 | 300 | 1.5 | 80 |
| 10 | 500 | 0.5 | 0.01 |
| 11 | 1000 | 10 | 150 |
| 12 | 400 | 3 | 200 |

Table 6 shows the synthesizing conditions, that is, the total flux of material gas, the ratio of ($CH_4/H_2$) in individual steps A, B, C, D, . . . and the pressure of the reaction chamber. In this case, the total flux is a sum of the flux of hydrogen gas and the flux of methane gas. The total flux of the material gas is 50 cc/m to 1500 cc/m in samples 1 to 12. The methane concentration in the material gas is represented by the volume ratio (vol%) of methane gas to the hydrogen gas. The methane ratio is distributed from 0 vol% to 10 vol % in the samples. The embodiments, samples 1, 2, 4 and 5 make diamond films by mode ①. Sample 3, sample 6 and sample 7 synthesize diamond by mode A. Sample 8 grows diamond film by mode ③.

Each embodiment (samples 1 to 8) has an initial methane concentration of 0 vol% (namely no carbon gas). Then the gas including 0.5vol%, 0.2vol% or 0.6vol% of carbon gas makes a (111) oriented thin film on the substrate.

By contrast, the comparison examples 9 to 12 have constant methane ratios between 0.5 vol% and 10 vol%. The pressure is 1 Torr (133Pa) to 250 Torr (33250Pa).

The samples are analysed by the X-ray diffraction method. The ratios of diffraction power among (111), (220), (311), (400) and (331) plane diffraction and the FWHM at 2 θ=(111) are measured. Table 7 indicates the results.

TABLE 7

Diffraction ratios of planes in X-ray diffraction analysis

| | X-ray diffraction 2 θ - θ scanning ratios of diffraction of planes | | | | | Locking 2θ = (111) fixed θ scanning |
|---|---|---|---|---|---|---|
| NO | (111) | (220) | (311) | (400) | (331) | FWHM (°) |
| 1 | 100 | 0 | 0 | 0 | 0 | 2 |
| 2 | 100 | 2 | 0 | 0 | 0 | 8 |
| 3 | 100 | 15 | 6 | 4 | 4 | 12 |
| 4 | 100 | 2 | 1 | 3 | 3 | 4 |
| 5 | 100 | 2 | 0 | 0 | 1 | 6 |
| 6 | 100 | 3 | 2 | 5 | 3 | 5 |
| 7 | 100 | 20 | 3 | 2 | 10 | 19 |
| 8 | 100 | 3 | 2 | 2 | 3 | 8 |
| 9 | 100 | 27 | 16 | 7 | 15 | 25 |
| 10 | 100 | 3 | 2 | 1 | 6 | 40 |
| 11 | 0 | 100 | 0 | 0 | 0 | 42 |
| 12 | 4 | 100 | 1 | 0 | 10 | 30 |

The diffraction angle and the plane spacing d satisfy Bragg's relation 2dsinθ=λ. The 2θ–θ scanning method shoots an object from the direction of an inclination angle θ to the surface and detects the power of the diffracted X-rays in the direction of θ to the surface. 2 θ is fixed to the (111)

plane and θ is scanned in the method. The power of the maximum diffraction is signified by "100". The power of other diffraction is denoted by the ratio. All the embodiments, i.e. samples 1 to 8, show the maximum value at (111) diffraction which is allotted with "100".

As mentioned before, a polycrystalline diamond shows the diffraction power ratios (111):(220):(311):(400):(331)= 100:27:16:7:15. Thus, a (111) oriented film is defined as a film having diffraction power of less than 27, 16, 7 and 15 from (220) planes, (311) planes, (400) planes and (331) planes respectively in the unit of 100 for the (111) diffraction. A good (111) oriented film reveals little peaks at the (220), (311), (400) and (331) diffraction. The existence of the strong (111) diffraction means that (111) planes are formed in parallel with the surface of the substrate in many diamond crystal granules.

Sample 1 has no diffraction other than the (111) plane diffraction. This fact means samples 1 is uniquely oriented in (111) direction. Namely, (111) planes of polycrystals are exclusively in parallel with the surface in sample 1. Samples 2,4, 5, 6 and 8 have little diffraction other than (111) plane diffraction. The FWHM is very small in samples 1, 2, 4, 5, 6 and 8. Then these samples are well (111) oriented, although they are polycrystalline.

Table 8 lists the roughness, the distortion of the samples and the ratio of the parallel layered defects examined by the TEM just after the synthesis of the diamond film.

TABLE 8

Roughness and distortion of diamond films

| NO | roughness after synthesis | | distortion | ratio of surface-parallel layered defects by TEM observation (%) |
|---|---|---|---|---|
| | R max (μm) | Ra (μm) | height H (μm) | |
| 1 | 8.3 | 1.2 | −8 | 95% |
| 2 | 3.7 | 1.3 | −20 | 94% |
| 3 | 7.3 | 2.4 | −145 | 85% |
| 4 | 1.5 | 0.7 | −34 | 93% |
| 5 | 0.9 | 0.4 | −3 | 91% |
| 6 | 2.8 | 0.9 | −18 | 90% |
| 7 | 9.3 | 2.2 | +3 | 81% |
| 8 | 1.1 | 0.42 | +27 | 41% |
| 9 | 1.4 | 5.3 | +220 | 5% |
| 10 | 0.9 | 0.3 | +330 | 12% |
| 11 | 140 | 15 | break of wafer | 0% |
| 12 | 3.5 | 1.1 | 0 | 0.5% |

The ratio of the parallel layered defects to the total layered defects is an important parameter for estimating the possibility of chipping in the mechanical polishing process. The parallel defects do not arise microbreaks in polishing, partly because the defects are parallel with the surface, and partly because the defects are very shallow. On the other hand, the non-parallel defects inclining at 70 degrees to the surface invite serious micro breaks in polishing. The total number of the layered defects is nearly constant. In a isotropic (111) crystal, 25% of the defects are parallel defects.

The embodiments, however exhibit high ratios of the parallel defects far beyond 25%. Samples 1, 2, 4, 5 and 6 show that more than 90% of the defects are parallel defects. Samples 3 and 7 indicate that more than 80% of the defects are parallel defects. Sample 8 shows 41% for the parallel defects, which is still higher than 25%. Sample 9, comparison example, has only 5% for parallel defects. Almost all of the layered defects are inclining at 70 degrees to the surface and often induce chipping in polishing.

The roughness of a surface is well signified by Rmax and Ra. Rmax is the maximum of differences of the height between peaks and valleys. Ra is the average of differences of the height between peaks and their neighboring valleys. Rmax of the diamond films of samples 1 to 12 is broadly distributed from 0.9 μm to 140 μm. Ra is dispersed between 0.3 μm and 15 μm.

Samples 1, 2, 4, 5 and 6 which have good (111)-oriented films have sufficiently small Rmax and Ra. This implies the excellence of (111) oriented films. In particular, sample 5 has a very small roughness of Rmax0.9 μm and Ra0.4 μm. Sample 5 has grown a very thin diamond film of a 5 μm thickness on an AlN substrate by the filament CVD method. Good smoothness probably originates partly from the thinness of the film and partly from the (111) orientation of the film.

Sample 8 has been produced by depositing a thin diamond film on a 4-inch quartz substrate by the filament CVD method. The smoothness of sample 8 is Rmax1.1 μm and Ra0.42 μm, which are the next lowest to sample 5. The thinness of the film suppresses the roughness. The small deviation from the (111) orientation probably degrades the smoothness of sample 8 in comparison with sample 5.

Samples 3 and 7 which include some non-(111) oriented components have an intermediate degree of the roughness.

In the comparison examples, sample 9 has a moderate roughness of Rmax14 μm and Ra5.3 μm. Sample 10 is favored with a smoothness of Rmax0.9 μm and Ra0.3 μm. The reason is that the diamond film is thin enough (t=2 μm). The smoothness of the substrate poly silicon is simply transcribed on the film. Sample 11, however, has an extremely big roughness of Rmax140 μm and Ra15 μm. The roughness probably results partly from too big thickness (1000 μm=1mm) of the diamond film and partly from the unsuitable (110) orientation of the film. Unfortunately, sample 11 is broken by the film deposition, which would be brought about by a large inner stress caused by the too thick film. Sample 12 has a small roughness of Rmax3.5 μm and Ra1.1 μm. The smoothness may be derived from the GaAs substrate.

Then the distortion of the samples is explained. Here the distortion is defined by the height H of the center from the plane including the circumference of a wafer. Distortion may otherwise be defined by the curvature or the radius of curvature. The definition by the height H is different from the other definition by the curvature. If two wafers have the same curvature, a broader wafer has a higher height H of distortion than a narrower wafer. If the distortion is spherical, the height H and the radius R of curvature satisfy the relation of $H=D^2/8R$.

The difference of the thermal expansion coefficients between the substrate and the diamond film causes compressive stress or tensile stress in the complex wafer. The inner stress deforms the complex wafer either into a convex-shape or into a concave-shape on the film side. The distortion parameter H is defined to be negative for the convex-distortion (H<0) but to be positive for the concave-distortion (H>0), which has been described before.

Samples 1 to 6 are deformed into a convex-shape (H<0), as shown in FIG. 1. The distortion is caused by the compressive stress in the diamond film and the tensile stress in the substrate. The convex-distortion of samples 1 to 6 ranges from −3 μm to −145 μm.

Samples 1, 2, 4, 5 and 6 which feature the dominance of (111) orientation are commonly favored with a moderate convex-distortion from −3 μm to −34 μm. Sample 3 which contains a little (110) and (311) oriented grains is deformed into a very big convex-distortion of H=−145 µm. Sample 7 which includes (110) and (331) oriented components is deformed into a quite small concave-distortion of +3 µm. Sample 8 which has a thin film (5 µm) on the quartz wafer is deformed into a concave-distorted (H=+27 µm) shape.

Among the comparison examples, sample 9 has a big positive distortion of +220 µm. Sample 10 has a still bigger positive distortion of +330 µm. The concave-distortion derives from the tensile stress in the diamond film and the compressive stress in the substrate. Sample 9 is a standard polycrystalline diamond, which induces such a big positive distortion. Sample 10 has only a very thin film (2 µm) on a Si(poly) substrate but invites a big-concave-distortion. The thin film bears a strong tensile stress. Sample 11 is broken down because of the big strain caused by a large film thickness of 1000 µm. Sample 12 which has a 30 µm thick diamond film on a 3-inch GaAs wafer has neither convex-distortion nor concave-distortion. Sample 12 is thus a flat wafer. Besides the flatness, sample 12 is favored with small roughness. Sample 12 seems a very promising wafer.

These complex wafers which have just been synthesized have all too big a roughness to make electronic devices on the films by photolithography which requires at least the smoothness of less than Rmax50nm and Ra20nm. The films must be polished till the desired smoothness.

Thus, the films are polished in the state of being stuck to the substrate by a polishing machine. After the polishing, the roughness and the distortion are measured for all the samples except sample 11 which cannot be polished due to the break of the substrate. Some of the samples cannot fully be whetted. Then the ratio of the polished parts to the whole surface is also measured. The roughness is of course reduced by the polishing. The distortion has a tendency of reducing by the polishing.

Figure 10:
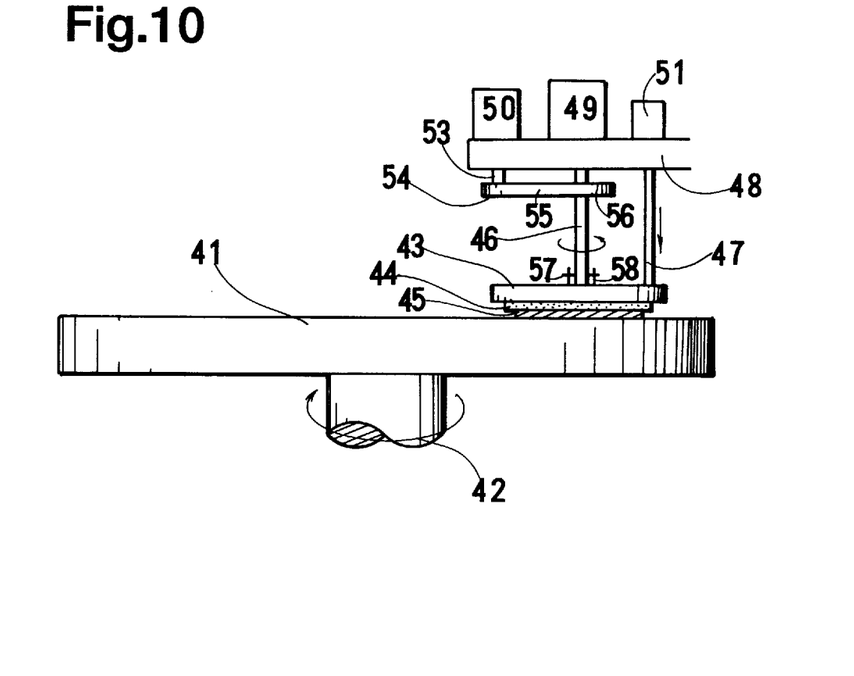
FIG. 10 is a front view of a polishing apparatus for whetting a diamond film.
Figure 11:
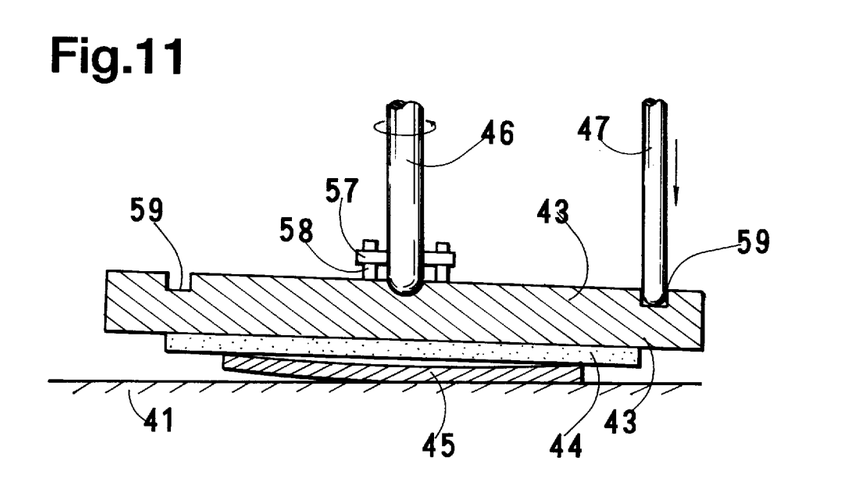
FIG. 11 is a sectional view of a holder, a wafer and a turn-table of the polishing apparatus.

FIG. 10 indicates a polishing apparatus for polishing a diamond wafer of this invention. FIG. 11 shows a sectional view of the holder, the wafer and the turn-table of the polishing apparatus. A turn-table (41) supported on a rotary shaft (42) rotates around the center axis of the shaft (42). Diamond powder is uniformly deposited on the turn-table (41). Thus, the upper surface of the turn-table (41) is fully coated with the diamond powder as a whetting material. Since there is no material harder than diamond, diamond powder is used for whetting diamond films. The diamond powder on the turn-table forcibly polishes the diamond object by dissipating itself. It takes hundreds of hours to polish such a hard object. In practice, a buffer plate (44) is glued to the bottom of a holder (43). Then a complex wafer (45) which has a substrate and a diamond film is stuck on the buffer plate (44). The buffer plate (44) is e.g., made from rubber. The buffer plate (44) protects the wafer by absorbing external shock. The use of the buffer plate is one of the contrivances of the polishing apparatus. A holder shaft (46) is fitted at the center of the upper surface of the holder (43). The holder shaft (46) is not tightly fixed to the holder (43) but is loosely connected by a universal joint to the holder (43). Transmitting the torque from the shaft to the holder, the universal joint allows the holder to incline to the holder shaft (46). Thus, the normal standing on the center of the holder does not always coincide with the shaft (46). The probability of the inclination of the holder shaft is another contrivance of the polishing machine. The holder (43) rotates around the shaft (46) and the turn-table (41) revolves around the rotary shaft (42).

An auxiliary shaft (47) presses a point of the upper surface of the holder (43) in order to determine the inclination of the holder on the turn-table (41). Upper ends of the auxiliary shaft (47) and the holder shaft (46) are supported by the arm (48). An oil pressure cylinder (49) is mounted on the arm (48) for applying pressure on the holder shaft (46). The oil pressure gives strong pressure to the holder (43) via the holder shaft (46) in order to whet the object by wearing out both the object diamond and the whetting powder diamond. A motor (50) is furnished on the arm (48) for rotating the holder shaft (46). The rotation torque is transmitted from an output shaft (53) of the motor (50) via a pulley (54), a belt (55) and another pulley (56) to the holder shaft (46). Then the holder (43) rotates around the shaft (46).

Another oil pressure cylinder (51) is upheld on the arm (48) for applying pressure on the auxiliary shaft (47). As exhibited in FIG. 11, a circular groove (59) has been dug at the periphery of the upper surface of the holder (43). The bottom of the auxiliary shaft (47) presses the groove (59). The holder shaft (46) allows the inclination of the holder. The wafer is convex-distorted to the turn-table. The pressure of the auxiliary shaft (47) inclines the holder (43) to the surface of the turn-table (41). The slanting angle is contingent on the pressure of the auxiliary shaft (47). The contact point of the wafer to the turn-table is determined by the ratio of the forces acting on the holder shaft (46) and the auxiliary shaft (47). A change of the pressure of the auxiliary shaft (47) varies the position of the contact point. All the surface of the wafer can be polished by transferring the contact point either from the center to the periphery or from the periphery to the center.

A distorted diamond film cannot fully be whetted by a conventional polishing apparatus which fixes the holder to the holder shaft. Some parts are left unpolished by the conventional polisher. Of course, if the whetting depth were to be increased to a big value larger than the film thickness, unpolished parts would not remain. Some other parts would entirely lose the diamond layer and would allow the substrate to appear.

Figure 12:
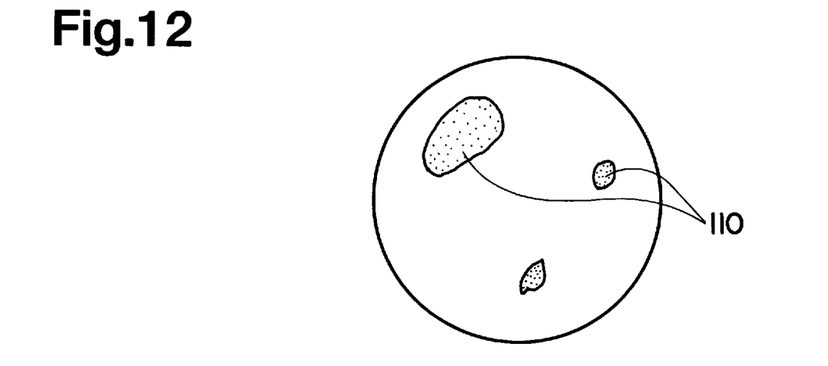
FIG. 12 is a plan view of a whetted diamond wafer which has been a flat wafer with no inherent distortion after the synthesis and has been polished by a conventional apparatus.
Figure 13:
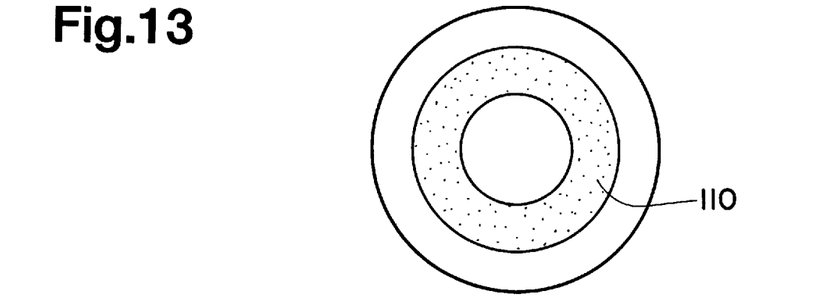
FIG. 13 is a plan view of a whetted diamond wafer which has been distorted in a concave form (H>0) after the synthesis and has been polished by a prior apparatus.
Figure 14:
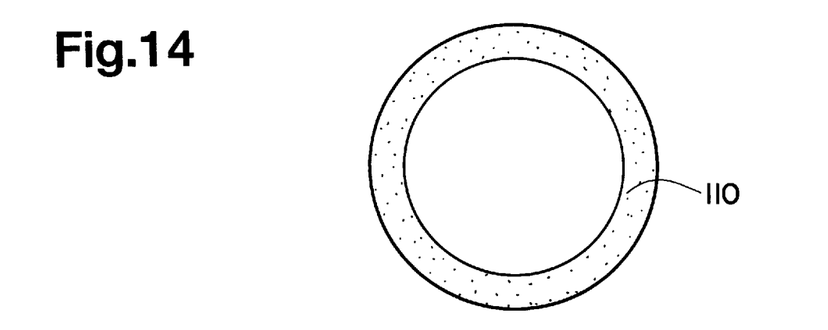
FIG. 14 is a plan view of a whetted diamond wafer which has been distorted in a convex shape (H<0) after the synthesis and has been polished by a conventional apparatus.

FIG. 12 to FIG. 15 denote the results of polishing the complex wafers by the conventional shaft-fixed holder and by the shaft-inclining holder of the present invention. FIG. 12 to FIG. 14 are plan views of the wafers polished by the-shaft-fixed holder. A flat wafer (H=0) which has been flat after the synthesis leaves unpolished parts randomly as shown in FIG. 12. Somebody may suppose that a flat wafer can be uniformly polished. The fact is otherwise. A flat wafer includes macroscopic convexes and concaves at random. The inherent anomaly survives the polishing. Then some portions remain unpolished. This result shows the incompetence of the flat wafer.

A concave-distorted wafer (H1>0) leaves an annular unpolished part in the middle region, as shown in FIG. 13, when it is whetted by the prior shaft-fixed holder. A convex-distorted wafer (H<0) leaves a peripheral circular region unpolished, as shown in FIG. 14, when it is polished by the prior apparatus.

Figure 15:
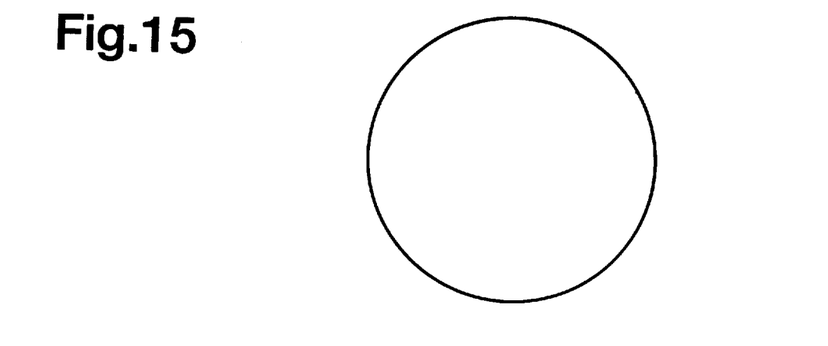
FIG. 15 is a plan view of a whetted diamond wafer which has been distorted in a convex shape (H<0) or in a concave shape (H>0) after the synthesis and has been polished by the apparatus of this invention.

By contrast, the whole surface is fully polished without unpolished part, when convex-distorted or concave-distorted wafers are whetted by the shaft-inclining holder of this invention, as exhibited in FIG. 15.

This result betrays the excellence of the polishing apparatus of FIG. 10 and FIG. 11. All the samples are polished by the polishing apparatus of this invention. The roughness, polished area and distortion are measured for all the samples after polishing.

Table 9 exhibits the roughness, the ratio of the polished parts and the distortion of the samples after the polishing.

TABLE 9

Roughness (nm), ratio of polished parts (%),
distortion (μm) of diamond wafer after polishing

| NO | roughness (nm) Rmax | Ra | ratio of polished parts (%) | distortion height H' (μm) |
|---|---|---|---|---|
| 1 | 4.3 | 0.8 | 100% polished | −6 |
| 2 | 12.5 | 3.2 | 100% polished | −17 |
| 3 | 48.2 | 18.1 | 100% polished | −61 |
| 4 | 3.4 | 1.7 | 100% polished | −12 |
| 5 | 0.7 | 0.21 | 100% polished | −2.2 |
| 6 | 1.8 | 0.8 | 100% polished | −11 |
| 7 | 11 | 8.2 | 100% polished | +2.5 |
| 8 | 32 | 13 | 100% polished | +17 |
| 9 | 92 | 68 | 30% unpolished | +205 |
| 10 | 153 | 63 | 50% unpolished | +310 |
| 11 | | | not polished, since substrate is broken. | |
| 12 | 122 | 53 | 10% unpolished | ±0.5 |

(Be careful of the unit (nm) of roughness. 1000 nm = 1 μm)

The unit of roughness is changed into nm (nanometer) here instead of μm (1 μm=1000nm) in Table 8. The roughness Rmax is distributed between Rmax0.7nm and Rmax153nm, and Ra is dispersed between Ra0.21nm and Ra68nm. Samples 1, 2, 4, 5 and 6 which have (111) oriented films attain all a sufficient smoothness of less than Rmaxnm and less than Ra20nm. Sample 1 has a roughness of the film to Rmax4.3nm and Ra0.8nm after the polishing. Rmax reduces to about 1/700. Ra decreases to about 1/1500. Sample 2 has Rmax12.5nm and Ra3.2nm. The reduction ratios are 1/300 and 1/400 for Rmax and Ra respectively. Sample 4 has Rmax3.4nm and Ra1.7nm.

Sample 5 which inherently has a small roughness before polishing obtains Rmax0.7nm and Ra0.21nm. The reduction ratios are 1/1200 and 1/2000. Sample 5 which is the smoothest specimen among the samples has been produced by depositing a 5 μm diamond film on a 3-inch AlN substrate by the filament CVD method. Furthermore, sample 5 shows a strong (111) orientation of the film. These conditions favor the production of the quite smooth film of sample 5. Sample 6 has also a satisfactory roughness of Rmax1.8nm and Ra0.8nm.

Samples 3, 7 and 8 which include (110) oriented crystals and (331) oriented crystals besides (111) ones have a little large roughness, although they content the requirement of the roughness of less than Rmax50nm and Ra20nm. Sample 3 which has originally a large roughness has Rmax48.2nm and Ra18.1nm after the polishing which are the biggest values among the embodiments of samples 1 to 8. Generally, Rmax or Ra is reduced to 1/100 to 1/2000 by the polishing of samples 1 to 7. Sample 8 is an exceptional case. Sample 8 which had a small initial roughness of Rmax1100nm and Ra420nm after the synthesis has still a considerably big roughness of Rmax32nm and Ra13nm after the polishing. The reduction ratios are 1/34 and 1/32. The small reduction may result from the unfavorable mode of distortion (concave-distortion). All the embodiments, that is, samples 1 to 8, are polished perfectly (100% polished). The final distortions H' have been slightly reduced from the original distortions H in all the embodiments.

Sample 9, a comparison example, has a roughness of Rmax92nm and Ra68nm which do not satisfy the requirement of the roughness of less than Rmax50nm and Ra20nm. This sample is inherently very rugged and is hard to polish because of (331) and (311) orientations and the large concave-distortion of +205 μm. About 30 % of the surface is left unpolished in sample 9.

Sample 10, another comparison example, which had initially a low roughness of Rmax 900nm and Ra300nm after the film formation has still a big roughness of Rmax153nm and Ra63nm after the polishing. The reduction ratios are only 1/6 and 1/5. 50% of the surface cannot be polished. The polishing is not effective, partly because the film is (331) oriented and partly because the distortion is a too big concave mode of +330 μm. Sample 9 and 10 indicate that a (331) oriented film is inappropriate for being polished.

Sample 11 is not polished, because it has been broken in the process of the film formation. Sample 12 which has a GaAs substrate was initially favored with a low roughness. But the polishing is not so effective for sample 12. The roughness after the polishing is Rmax122nm and Ra53nm which cannot content the requirement of photolithograpy. The reduction is only 1/30 in Rmax and 1/20 in Ra. Sample 12 seemed to be a good specimen both because of the initial small roughness and because of the flatness of the wafer. The truth is otherwise. Sample 12 has drawbacks of a large roughness and an existence of 10% of unpolished part after the polishing. A flat wafer has small convexes and concaves on the film. The small irregularity of a flat film impedes the polishing function. The other reason is (331) orientation of the film, which also prevents the polishing.

The polishing slightly reduces the distortion but does not change the distortion mode. Samples 1 to 6 are convex-distorted. Samples 7, 8, 9 and 10 are concave-distorted. The embodiments, i.e. sample 1 to sample 8, have very smooth surfaces having a small roughness of Rmax0.7nm to Rmax48.2nm and Ra0.21nm to Ra18.1nm. The comparison examples 9, 10 and 12 are annoyed by a big roughness between Rmax92nm and Rmax153nm and between Ra53nm and Ra68nm.

Then an aluminum film with a thickness of 50nm (=0.05 μm) is evaporated on the diamond film of each sample. FIG. 6 denotes the section of the wafer. Comb-shaped electrodes are produced on the diamond film by selectively etching the Al film into parallel electrode patterns by photolithography. The line width of the electrodes is varied between 0.6 μm and 2 μm. The comb-shaped electrode is sometimes called an interdigital transducer which plays the role of an input electrode or an output electrode of an SAW device. Since the diamond films have the microscopic roughness, as listed in Table 9, there is some probability of wire-cutting of the interdigital transducers formed on the diamond film as an undercoat. Then the ratios of the specimens which are immune from the trouble of wire-cutting are counted. Table 10 denotes the line width of the aluminum interdigital electrodes and the yield to wire-cutting of the samples.

TABLE 10

Width of aluminum electrodes and
yield against wire cut of aluminum electrode formed
on diamond films by evaporation and photolithography

| NO | width of aluminum electrodes (μm) | yield against wire cut (%) |
|---|---|---|
| 1 | 1 | 98% |
| 2 | 0.8 | 96% |
| 3 | 1.2 | 90% |
| 4 | 1.5 | 95% |
| 5 | 0.6 | 94% |
| 6 | 1 | 98% |
| 7 | 0.8 | 93% |
| 8 | 2 | 91% |
| 9 | Electrodes are not formed, because of wide unpolished parts | |

TABLE 10-continued

Width of aluminum electrodes and
yield against wire cut of aluminum electrode formed
on diamond films by evaporation and photolithography

| NO | width of aluminum electrodes ($\mu$m) | yield against wire cut (%) |
|---|---|---|
| 10 | 1 | 2% |
| 11 | Substrate is broken during synthesis, not polished, not make electrodes | |
| 12 | 0.8 | 15% |

The line width of the aluminum electrodes ranges from 0.6 $\mu$m to 2 $\mu$m. Samples 1 to 8, i.e. the embodiments, exhibit a high yield against wire-cutting of more than 90 %. Then wire-cutting scarcely occurs in almost all of the embodiments. This results from the excellent smoothness of the polished diamond films. Samples 1 and 6 enjoy an extremely high yield of 98 %. Sample 2, in particular, which has the second narrowest line width of 0.8 $\mu$m, enjoys a high yield of 96%. Sample 5 with the narrowest width of 0.6 $\mu$m has still a yield of 94%. Sample 3 has the lowest yield of 90% among the embodiments. The low yield is derived from the considerably high roughness of the film which is caused by the mixture of (110),(311),(400) and (331) oriented crystals in the dominant (111) crystals. Similarly, the low yield of sample 8 originates from the mixture of (110) and (331) oriented crystals in the film. The result shows that the diamond wafers produced by the present invention are capable of using as substrates of surface acoustic wave devices, in which the diamond film raises the speed of the surface acoustic waves.

In the comparison examples, sample 9 has too wide unpolished parts. Thus electrodes are not formed on sample 9. Although sample 10 has wide unpolished parts, electrodes of a 1 $\mu$m width are formed on sample 10 for examining the yield against wire-cutting. The yield is 2%. Almost all electrodes are cut on sample 10. Sample 12 has 10% of unpolished parts. Electrodes are produced on the polished portions. The yield is 15%. Samples 10 and 12 have a drawback of a low yield of the interdigital transducers. This is caused by the big roughness of the undercoat diamond film. Parts of the Al patterns cannot adhere to the rugged film, and the Al wires are cut by the rugged film. The formation of good electrodes requires a sufficient smoothness of the diamond films.

What we claim is:

1. A method of producing a wafer comprising the steps of: setting a substrate on a susceptor in a reaction chamber, heating the substrate, supplying at least two different material gases including hydrogen gas and a hydrocarbon gas with different ratios periodically to the reaction chamber, exciting the material gas by heat, microwave, RF-discharge or DC-discharge, growing a (111) oriented polycrystalline diamond film on the heated substrate and polishing the diamond film to a roughness of less than Rmax50 nm and less than Ra20 nm.

2. A method as claimed in claim 1, wherein one of the material gas includes lower concentration of carbon atoms with an atomic ratio of X=C/H between 0% and 1% and the other material gas includes higher concentration of carbon atoms with an atomic ratio of Y=C/H between 1% and 8%.

3. A method as claimed in claim 2, wherein the time interval a of the lower carbon concentration gas is longer than the time interval b of the higher carbon concentration gas.

4. A method as claimed in claim 3, wherein the ratio of the time Interval b to a period T satisfies inequalities, $$0.01 \leq b/(a+b) \leq 0.5.$$

5. A method as claimed in claim 4, wherein an absolute value of the distortion height H which is defined as a height of the center from a plane including a circumference of the substrate ranges between 2 $\mu$m and 150 $\mu$m after the growth of the film and an absolute value of the distortion height ranges from 2 $\mu$m to 150 $\mu$m after the polishing.

\* \* \* \* \*